(12) United States Patent
Yoshizaki et al.

(10) Patent No.: US 11,492,512 B2
(45) Date of Patent: Nov. 8, 2022

(54) POLISHING COMPOSITION AND POLISHING METHOD

(71) Applicant: FUJIMI INCORPORATED, Kiyosu (JP)

(72) Inventors: Yukinobu Yoshizaki, Kiyosu (JP); Ayano Yamazaki, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 17/030,855

(22) Filed: Sep. 24, 2020

(65) Prior Publication Data

US 2021/0095161 A1 Apr. 1, 2021

(30) Foreign Application Priority Data

Sep. 26, 2019 (JP) .............................. JP2019-175307
Feb. 26, 2020 (JP) .............................. JP2020-030986

(51) Int. Cl.
*C09G 1/02* (2006.01)
*H05K 3/26* (2006.01)

(52) U.S. Cl.
CPC ................. *C09G 1/02* (2013.01); *H05K 3/26* (2013.01); *H05K 2203/0756* (2013.01)

(58) Field of Classification Search
CPC .... C09G 1/02; C09G 1/00; C23F 1/10; C09K 13/00; H05K 3/26; H05K 2203/0756; H01L 21/30625
USPC .... 252/79.1, 79.2, 79.3, 79.4; 438/691, 692, 438/693
See application file for complete search history.

(56) References Cited

U.S. PATENT DOCUMENTS

| 8,821,215 | B2 * | 9/2014 | Naguib Sant | ........ C09K 3/1463 106/3 |
| 2010/0221918 | A1 * | 9/2010 | Takemura | ........... H01L 21/3212 438/693 |
| 2015/0380263 | A1 * | 12/2015 | Lan | ................... H01L 21/30625 438/693 |
| 2016/0272846 | A1 * | 9/2016 | Tsuchiya | ............... C08F 216/06 |

FOREIGN PATENT DOCUMENTS

| JP | 2008-85058 A | 4/2008 |
| JP | 2015-86355 A | 5/2015 |
| WO | WO-2019/116833 A | 6/2019 |

* cited by examiner

*Primary Examiner* — Lan Vinh
(74) *Attorney, Agent, or Firm* — Foley & Lardner LLP

(57) ABSTRACT

To provide a polishing composition suitable for the use of polishing a polishing object having a film containing a silicon material having a silicon-silicon bond formed on a pattern containing an insulating film by a CMP method to form circuit patterns containing the silicon material and capable of also suppressing a remarkable reduction in polishing removal rate.

A polishing composition of this invention contains abrasives, a first water-soluble polymer containing a polymer compound containing a lactam ring and having a weight average molecular weight of less than 300,000, a second water-soluble polymer containing a polymer compound containing a lactam ring and having a weight average molecular weight smaller than that of the first water-soluble polymer, a basic compound, and water.

14 Claims, 4 Drawing Sheets

POLISHING COMPOSITION AND POLISHING METHOD

BACKGROUND OF THE INVENTION

Field of the Invention

The present invention relates to a polishing composition and a polishing method.

Description of the Related Art

In recent years, with multilayer-wiring on the surface of a semiconductor substrate, a so-called chemical mechanical polishing (CMP) art of polishing the semiconductor substrate for planarization has been used in manufacturing a device. The CMP is a method for planarizing the surface of a polishing object (object to be polished), such as a semiconductor substrate, using a polishing composition (slurry) containing abrasives, such as silica, alumina, and ceria, an anticorrosive, a surfactant, and the like. Examples of the polishing object (object to be polished) include silicon, polysilicon, a silicon oxide film (silicon oxide), silicon nitride, wiring lines containing a metal and the like, a plug, and the like.

For the polishing composition used in polishing a semiconductor substrate by the CMP, various proposals have been made so far.

For example, PTL 1 describes a polishing composition for improving the polishing characteristics to polysilicon, particularly improving level difference elimination efficiency. The polishing composition contains abrasives (colloidal silica) and an oxidant and has a pH of 6 or more. It is described that the polishing composition improves level difference elimination characteristics to a polishing object having a level difference because the oxidant applies a chemical action to chemically polish the surface of polysilicon which is a polishing object in the composition having a pH of 6 or more.

Moreover, PTL 1 describes a polishing composition containing 500 ppm of polyvinylpyrrolidone having a weight average molecular weight of 40,000 as an example of a water-soluble polymer which is an additive compounded in order to further improve the level difference elimination efficiency. The polishing composition has a pH of 9 and contains 0.1 mass % of hydrogen peroxide.

PTL 2 describes an additive for CMP abrasives containing an organic compound having an acetylene bond, a water-soluble vinyl polymer, and water, having a pH of 4 to 9, and capable of polishing an inorganic insulating film for semiconductors by being combined with a cerium oxide slurry for semiconductors. It is described that the compounding of the additive can improve the polishing uniformity of the entire surface of the wafer plane to improve the planarization characteristics of the entire surface of the wafer plane. Polyvinylpyrrolidone is not illustrated as the water-soluble vinyl polymer.

PTL 3 describes, as a polishing composition for the use of roughly polishing a silicon wafer, a polishing composition containing abrasives, a nitrogen containing water-soluble polymer (polyvinylpyrrolidone, content of 0.005 mass % or less) containing two kinds of the same structure different in weight average molecular weight (first nitrogen containing water-soluble polymer and second nitrogen containing water-soluble polymer), a basic compound, and water. Moreover, as the compounding ratio of the two kinds of the nitrogen containing water-soluble polymers, First nitrogen containing water-soluble polymer (weight average molecular weight of 300,000 or more):Second nitrogen containing water-soluble polymer (weight average molecular weight of less than 300,000)=5:1 to 1:20 is descried.

CITATION LIST

Patent Literature

PTL 1: JP 2015-86355 A
PTL 2: JP 2008-85058 A
PTL 3: WO 2019/116833

SUMMARY OF THE INVENTION

A step of manufacturing a semiconductor device includes polishing a polishing object having a polysilicon film (film containing a silicon material having a silicon-silicon bond) formed on a pattern containing a silicon nitride film (insulating film) by the CMP method to form circuit patterns containing the polysilicon film, for example. Examples of problems occurring in the polishing include the occurrence of dishing in which the upper surface of the circuit patterns containing the polysilicon films is dented in a dish shape, the occurrence of erosion by scraping off of the upper surface of the silicon nitride film between wiring lines, and the occurrence of a state in which the polysilicon film to be scraped off remains, so that the silicon nitride film between the circuit patterns is not exposed.

Although the polishing composition described in PTL 1 aims at the suppression of the dishing, the polishing removal rate of the polysilicon film remarkably decreases because the oxidant is contained. The CMP abrasive described in PTL 2 contains cerium oxide as abrasives. The cerium oxide is generally expensive and easy to precipitate, and therefore is inferior in storage stability.

The polishing composition described in PTL 3 contains the water-soluble polymer having a molecular weight of 300,000 or more, and therefore is not suitable for "the use of polishing a polishing object having a film containing a silicon material having a silicon-silicon bond formed on a pattern containing an insulating film by the CMP method to form circuit patterns containing the silicon material having a silicon-silicon bond".

It is an object of the present invention to provide a polishing composition suitable for the use of polishing a polishing object having a film containing a silicon material having a silicon-silicon bond formed on a pattern containing an insulating film by a CMP method to form circuit patterns containing the silicon material having a silicon-silicon bond (the above-described problems are suppressed) and also capable of suppressing a remarkable reduction in polishing removal rate.

In order to solve the above-described problems, a polishing composition according to one aspect of the present invention contains abrasives, a first water-soluble polymer containing a polymer compound containing a lactam ring and having a weight average molecular weight of less than 300,000, a second water-soluble polymer containing a polymer compound containing a lactam ring and having a weight average molecular weight smaller than that of the first water-soluble polymer, a basic compound, and water.

The present invention can provide a polishing composition suitable for the use of polishing a polishing object having a film containing a silicon material having a silicon-silicon bond formed on a pattern containing an insulating film by a CMP method to form circuit patterns containing the silicon material having a silicon-silicon bond and also capable of suppressing a remarkable reduction in polishing removal rate.

DESCRIPTION OF THE PREFERRED EMBODIMENTS

One Aspect of Present Invention

Figure 1:
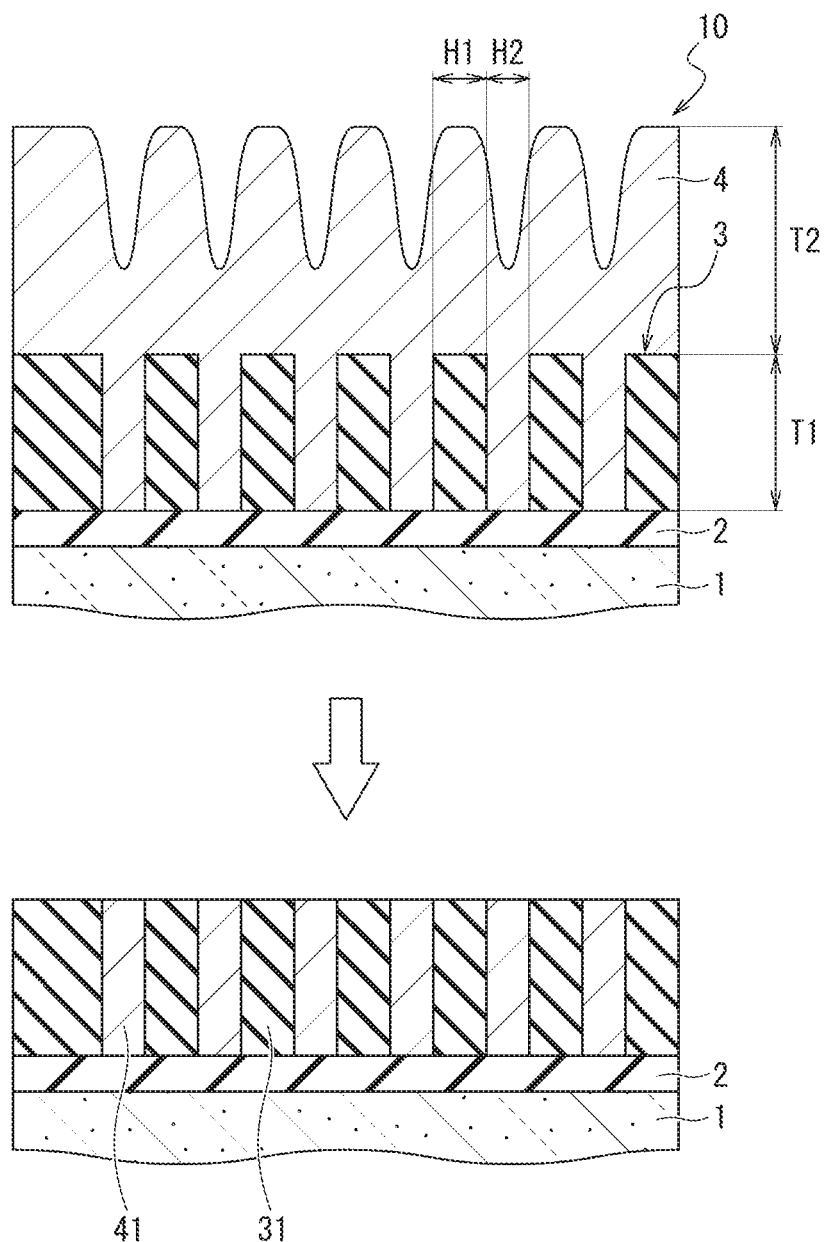
FIG. 1 is a cross-sectional view illustrating a polishing object subjected to a polishing test in Examples and an ideal polishing state of the polishing object.

As described above, a polishing composition according to one aspect of the present invention contains silica abrasives, a first water-soluble polymer containing a polymer compound containing a lactam ring and having a weight average molecular weight of less than 300,000, a second water-soluble polymer containing a polymer compound containing a lactam ring and having a weight average molecular weight smaller than that of the first water-soluble polymer, a basic compound, and water.

According to the polishing composition of one aspect of the present invention, due to the fact that both the first water-soluble polymer and the second water-soluble polymer are contained, the polishing characteristics in polishing a polishing object containing a film containing a silicon material having a silicon-silicon bond is improved as compared with a polishing composition not containing both the first water-soluble polymer and the second water-soluble polymer or containing only either one of them.

Both the first water-soluble polymer and the second water-soluble polymer contain the polymer compound containing a lactam ring and have a weight average molecular weight of less than 300,000. The weight average molecular weight of the second water-soluble polymer is smaller than the weight average molecular weight of the first water-soluble polymer. Due to the fact that both such first water-soluble polymer and second water-soluble polymer (weight average molecular weight of less than 300,000) are contained, in carrying out a polishing method including "polishing a polishing object having a film containing a silicon material having a silicon-silicon bond formed on a pattern containing an insulating film by a CMP method to form circuit patterns containing the silicon material having a silicon-silicon bond", dishing of the circuit patterns is suppressed, erosion of the insulating film is suppressed, and the occurrence of a state in which the insulating film between the circuit patterns is not exposed is suppressed as compared with the polishing composition not containing both of the first water-soluble polymer and the second water-soluble polymer or containing only either one of them.

Even in the case where the two water-soluble polymers containing the polymer compound containing a lactam ring and different in weight average molecular weight are contained, when the weight average molecular weight of one of the water-soluble polymers is 300,000 or more, the state in which the insulating film between the circuit patterns is not exposed tends to be reached in carrying out the above-described polishing method.

The polishing composition of one aspect of the present invention obtains the actions and the effects described above due to containing both the first water-soluble polymer and the second water-soluble polymer and does not need to contain an oxidant, and therefore does not cause a remarkable reduction in polishing removal rate as in the polishing composition of PTL 1 containing an oxidant.

Detailed Description about One Aspect of Present Invention

Hereinafter, one aspect of the present invention is described in detail.

<Polishing Object>

Examples of the use of the polishing composition of one aspect of the present invention include polishing of a polishing object containing a film containing a silicon material having a silicon-silicon bond.

Examples of the silicon material having a silicon-silicon bond include Si alloys, such as polysilicon (Poly-Si), amorphous silicon, single crystal silicon, n-type doped single crystal silicon, p-type doped single crystal silicon, and SiGe, and the like, for example. In particular, the polishing composition is suitable for the use of polishing substances containing a polysilicon film.

The polishing object containing the film containing the silicon material having a silicon-silicon bond contains silicon oxide, silicon nitride, silicon carbonitride (SiCN), metal, and the like, for example, as materials other than the silicon material having a silicon-silicon bond.

<Abrasives>

The polishing composition of one aspect of the present invention contains silica abrasives (abrasives containing silica particles). When cerium oxide is used as abrasives, a residue of the cerium oxide tends to remain on the polishing object after polishing. Therefore, it is not preferable to use the cerium oxide.

Examples of the kind of the silica particles include, but are not particularly limited thereto, fumed silica, colloidal silica, and the like and colloidal silica is preferable. Examples of a method for manufacturing colloidal silica include a sodium silicate process and a sol-gel process. Colloidal silica manufactured by either manufacturing method is suitably used as the silica particles configuring the polishing composition of one aspect of the present invention.

However, colloidal silica manufactured by the sol-gel method is preferable from the viewpoint of reducing metal impurities. The colloidal silica manufactured by the sol-gel method is preferable because the content of metal impurities or corrosive ions, such as chloride ions, having a property of diffusing in a semiconductor is low. The colloidal silica by the sol-gel method can be manufactured using conventionally known techniques. Specifically, the colloidal silica can be obtained by performing a hydrolysis/condensation reaction using a hydrolyzable silicon compound (for example, alkoxysilane or a derivative thereof) as a raw material.

The silica particles may have a cationic group. More specifically, the silica particles may be cation-modified silica particles or may be cation-modified colloidal silica. As the colloidal silica having a cationic group (cation-modified colloidal silica), colloidal silica having an amino group immobilized on the surface is preferably mentioned. Examples of a method for manufacturing such colloidal silica having a cationic group include a method including immobilizing a silane coupling agent having amino groups, such as aminoethyltrimethoxysilane, aminopropyltrimethoxysilane, aminoethyltriethoxysilane, aminopropyltriethoxysilane, aminopropyldimethylethoxysilane, aminopropylmetyldiethoxysilane, and aminobutyltriethoxysilane, on the surface of the silica particles described in JP 2005-162533 A. Thus, the colloidal silica having an amino group immobilized on the surface (amino group-modified colloidal silica) can be obtained.

The colloidal silica may have an anionic group. More specifically, the silica particles may be anion-modified silica particles or may be anion-modified colloidal silica. Examples of the colloidal silica having an anionic group (anion-modified colloidal silica) preferably include colloidal silica having anionic groups, such as a carboxylic acid group, a sulfonic acid group, a phosphonic acid group, and an aluminic acid group, immobilized on the surface. Examples of a method for manufacturing such colloidal silica having anionic groups include, but are not particularly limited thereto, a method including reacting a silane coupling agent having an anionic group at the terminal and colloidal silica to each other, for example.

As a specific example, when a sulfonic acid group is immobilized on the colloidal silica, the immobilization can be performed by a method described in "Sulfonic acid-functionalized silica through of thiol groups" Chem. Commun. 246-247 (2003), for example. Specifically, colloidal silica having a sulfonic acid group immobilized on the surface (sulfonic acid-modified colloidal silica) can be obtained by coupling a silane coupling agent having a thiol group, such as 3-mercaptopropyltrimethoxysilane, to colloidal silica, followed by oxidation of the thiol group with hydrogen peroxide.

When a carboxylic acid group is immobilized on colloidal silica, the immobilization can be performed by a method described in "Novel Silane Coupling Agents Containing a Photolabile 2-Nitrobenzyl Ester for Introduction of a Carboxy Group on the Surface of Silica Gel", Chemistry Letters, 3, 228-229 (2000), for example. Specifically, colloidal silica having a carboxylic acid group immobilized on the surface (carboxylic acid-modified colloidal silica) can be obtained by coupling a silane coupling agent containing photoreactive 2-nitrobenzyl ester to colloidal silica followed by irradiation with light.

The shape of the silica particles is not particularly limited and may be a spherical shape or may be a non-spherical shape. Specific examples of the non-spherical shape include various shapes, such as polygonal column shapes, such as a triangular column and a square column, a cylindrical shape, a bale shape in which a central portion of a column is more inflated than end portions, a doughnut shape in which a central portion of a disk is penetrated, a plate shape, a so-called cocoon shape having constriction in a central portion, a so-called associative spherical shape in which a plurality of particles is integrated, a so-called konpeito- (pointed sugar candy ball-) like shape having a plurality of projections on the surface, and a rugby ball shape but are not particularly limited thereto.

The size of the silica particles is not particularly limited. However, the average primary particle diameter of the silica particles is preferably 20 nm or more, more preferably 40 nm or more, still more preferably 50 nm or more, and particularly preferably 60 nm or more. The average primary particle diameter of the silica particles is preferably 250 nm or less, more preferably 200 nm or less, still more preferably 150 nm or less, and particularly preferably 100 nm or less. Within such a range, defects, such as scratches, in the surface of the polishing object after polishing using the polishing composition can be suppressed. More specifically, the average primary particle diameter of the silica particles is preferably 20 nm or more and 250 nm or less, more preferably 40 nm or more and 200 nm or less, still more preferably 50 nm or more and 150 nm or less, and particularly preferably 60 nm or more and 100 nm or less. The average primary particle diameter of the silica particles is calculated based on the specific surface area of the silica particles measured by a BET method, for example.

The average secondary particle diameter of the silica particles is preferably 50 nm or more, more preferably 80 nm or more, still more preferably 100 nm or more, and particularly preferably 120 nm or more. The average secondary particle diameter of the silica particles is preferably 500 nm or less, more preferably 400 nm or less, still more preferably 300 nm or less, and particularly preferably 250 nm or less. Within such a range, defects, such as scratches, in the surface of the polishing object after polishing using the polishing composition can be suppressed. More specifically, the average secondary particle diameter of the silica particles is preferably 50 nm or more and 500 nm or less, more preferably 80 nm or more and 400 nm or less, still more preferably 100 nm or more and 300 nm or less, and particularly preferably 120 nm or more and 250 nm or less. The average secondary particle diameter of the silica particles can be measured by a dynamic light scattering method typified by a laser diffraction scattering method, for example.

The average association degree of the silica particles is preferably 5.0 or less, more preferably 3.0 or less, and still more preferably 2.5 or less. The generation of the defects in the surface of the polishing object can be further reduced with a reduction in the average association degree of the silica particles. The average association degree of the silica particles is preferably 1.0 or more and more preferably 1.2 or more. With an increase in the average association degree of the silica particles, there is an advantage that the polishing removal rate by the polishing composition is improved. The average association degree of the silica particles is obtained by dividing the value of the average secondary particle diameter of the silica particles by the value of the average primary particle diameter of the silica particles.

The aspect ratio of the silica particles is not particularly limited and is preferably less than 2.0, more preferably 1.8 or less, and still more preferably 1.5 or less. Within such a range, defects in the surface of the polishing object can be further reduced. The aspect ratio is the average of values obtained by taking the smallest rectangle circumscribing an image of the silica particles with a scanning electron microscope, and then dividing the length of the long side of the rectangle by the length of the short side of the same rectangle and can be obtained using general image analysis software. The aspect ratio of the silica particles is not particularly limited and is preferably 1.0 or more.

In a particle diameter distribution determined by a laser diffraction scattering method of the silica particles, D90/D10 which is a ratio of a particle diameter when the cumulative particle weight reaches 90% of the total particle weight from the fine particle side (D90) to a particle diameter when the cumulative particle weight reaches 10% of the total particle weight (D10) is not particularly limited and is preferably 1.1 or more, more preferably 1.2 or more, and still more preferably 1.3 or more. Moreover, in the particle diameter distribution determined by the laser diffraction scattering method in the silica particles in the polishing composition, the ratio D90/D10 of the particle diameter when the cumulative particle weight reaches 90% of the total particle weight from the fine particle side (D90) to the particle diameter when the cumulative particle weight reaches 10% of the total particle weight (D10) is not particularly limited and is preferably 2.04 or less. Within such a range, defects in the surface of the polishing object can be further reduced.

The sizes (average primary particle diameter, average secondary particle diameter, aspect ratio, D90/D10, and the like) of the silica particles can be appropriately controlled by the selection of a method for manufacturing the silica particles or the like.

The content (concentration) of the silica particles in the polishing composition of one aspect of the present invention is preferably 0.01 mass % or more, more preferably 0.05 mass % or more, still more preferably 0.1 mass % or more, and particularly preferably 0.5 mass % or more. The content of the silica particles in the polishing composition is preferably 20 mass % or less, more preferably 10 mass % or less, still more preferably 5 mass % or less, and particularly preferably 3 mass % or less. When the content of the silica particles is within such a range, the occurrence of surface defects in the surface of the polishing object after polishing using the polishing composition can be further suppressed. When the polishing composition contains two or more kinds of silica particles, the content of the silica particles means the total amount of the silica particles.

The polishing composition of one aspect of the present invention may also contain other abrasives in addition to the silica particles. Examples of the other abrasives include metal oxide particles, such as alumina particles, zirconia particles, and titania particles, for example.

<First Water-Soluble Polymer, Second Water-Soluble Polymer>

The polishing composition of one aspect of the present invention contains the first water-soluble polymer containing the polymer compound containing a lactam ring and having a weight average molecular weight of less than 300,000 and the second water-soluble polymer containing the polymer compound containing a lactam ring and having a weight average molecular weight smaller than that of the first water-soluble polymer.

The weight average molecular weight of the first water-soluble polymer is preferably 25,000 or more and less than 300,000, more preferably 30,000 or more and 200,000 or less, and still more preferably 35,000 or more and 150,000 or less.

The weight average molecular weight of the second water-soluble polymer is preferably 1,000 or more and less than 25,000, more preferably 3,000 or more and 20,000 or less, and still more preferably 5,000 or more and 15,000 or less.

As a combination of the weight average molecular weight of the first water-soluble polymer and the weight average molecular weight of the second water-soluble polymer, it is preferable that the weight average molecular weight of the first water-soluble polymer is 25,000 or more and less than 300,000 and the weight average molecular weight of the second water-soluble polymer is 1,000 or more and less than 25,000, it is more preferable that the weight average molecular weight of the first water-soluble polymer is 30,000 or more and 200,000 or less and the weight average molecular weight of the second water-soluble polymer is 3,000 or more and 20,000 or less, and it is still more preferable that the weight average molecular weight of the first water-soluble polymer is 35,000 or more and 150,000 or less and the weight average molecular weight of the second water-soluble polymer is 5,000 or more and 15,000 or less.

Examples of the first water-soluble polymer and the second water-soluble polymer copolymer include homopolymers containing a monomer containing a compound containing a lactam ring or copolymers containing the monomer containing a compound containing a lactam ring and a monomer containing a compound not containing a lactam ring.

Examples of the monomer containing a compound containing a lactam ring include vinylpyrrolidone, vinylcaprolactam, vinylvalerolactam, vinyllaurolactam, and vinylpiperidone.

Examples of the homopolymers containing the monomer containing a compound containing a lactam ring include at least one kind selected from the group consisting of polyvinylpyrrolidone, polyvinylcaprolactam, polyvinylvalerolactam, polyvinyllaurolactam, and polyvinylpiperidone.

The first water-soluble polymer and the second water-soluble polymer are particularly preferably polyvinylpyrrolidones.

In the polishing composition of one aspect of the present invention, the total content of the first water-soluble polymer and the second water-soluble polymer is preferably 0.05 mass % or less. Such a range is advantageous for maintaining a high polishing removal rate of polysilicon.

In the polishing composition of one aspect of the present invention, a ratio of a content (W1) of the first water-soluble polymer to a content (W2) of the second water-soluble polymer (W1/W2) is preferably 1/15 or more and 15/1 or less, more preferably 1/10 or more and 10/1 or less, and particularly preferably 1.

<Basic Compound>

The polishing composition of one aspect of the present invention contains a basic compound.

Examples of the basic compound contained in the polishing composition of one aspect of the present invention include, for example, at least one kind of alkali compound selected from the group consisting of hydroxides of alkali metals, alkali metal salts of inorganic acids, ammonium salts of inorganic acids, alkali metal salts of organic acids, ammonium salts of organic acids, and ammonia. The use of these alkali compounds enables not only the pH adjustment in an alkaline region where the silicon contained in the polishing object is easily dissolved but the realization of efficient polishing without blocking the removal of silicon because most of the alkali compound is dissolved in a dispersion medium without adsorbing to the surface of the abrasives or the surface of the polishing object during polishing.

Examples of the hydroxides of alkali metals include lithium hydroxides, sodium hydroxides, potassium hydroxides, and the like.

Examples of the alkali metal salts of inorganic acids include alkali metal salts of nitrous acids, such as sodium nitrite and potassium nitrite; alkali metal salts of nitric acids, such as sodium nitrate and potassium nitrate; alkali metal salts of molybdic acids, such as sodium molybdate and potassium molybdate; alkali metal salts of hypochlorous acids, such as sodium hypochlorite and potassium hypochlorite; alkali metal salts of sulfuric acids, such as sodium sulfate and potassium sulfate; alkali metal salts of carbonic acids, such as sodium carbonate and potassium carbonate; alkali metal salts of hydrochloric acid, such as sodium chloride and potassium chloride; alkali metal salts of phosphoric acids, such as sodium phosphate and potassium phosphate; alkali metal salts of silicic acids, such as sodium silicate and potassium silicate; alkali metal salts of boric acids, such as sodium borate and potassium borate, and the like.

Examples of the ammonium salts of inorganic acids include ammonium chloride, ammonium sulfate, ammonium amidosulfate, ammonium nitrate, monoammonium dihydrogen phosphate, diammonium hydrogen phosphate, triammonium phosphate, ammonium hypophosphite, ammonium carbonate, ammonium hydrogencarbonate, ammonium sulfide, ammonium borate, ammonium fluoroborate, and the like.

Examples of the alkali metal salts of organic acids include sodium acetate, potassium acetate, sodium propionate, potassium propionate, sodium glycerate, potassium glycerate, sodium malate, potassium malate, sodium citrate, potassium citrate, sodium lactate, potassium lactate, sodium tartrate, potassium tartrate, sodium salicylate, potassium salicylate, sodium malonate, potassium malonate, sodium succinate, potassium succinate, sodium maleate, potassium maleate, sodium phthalate, potassium phthalate, sodium oxalate, potassium oxalate, sodium glutarate, potassium glutarate, sodium abietate, potassium abietate, sodium sorbate, potassium sorbate, sodium 2,4,6-octatriene-1-carboxylate, potassium 2,4,6-octatriene-1-carboxylate, sodium eleostearate, potassium eleostearate, sodium 2,4,6,8-decatetraene-1-carboxylate, potassium 2,4,6,8-decatetraene-1-carboxylate, sodium retinoate, potassium retinoate, and potassium iminodiacetate.

Examples of the ammonium salts of organic acids include ammonium formate, ammonium acetate, diammonium oxalate, ammonium hydrogen oxalate, ammonium benzoate, monoammonium citrate, diammonium citrate, triammonium citrate, ammonium lactate, ammonium phthalate, ammonium succinate, monoammonium tartrate, diammonium tartrate, ammonium aspartate, and the like.

Among these alkali compounds, it is preferable to use at least one kind selected from potassium hydroxides, potassium salts of inorganic acids, ammonium salts of inorganic acids, potassium salts of organic acids, ammonium salts of organic acids, and ammonia from the purpose of preventing malfunctions of a semiconductor obtained by being polished.

<Water>

The polishing composition of one aspect of the present invention contains water as a dispersion medium.

From the viewpoint of suppressing the contamination of the polishing object or the blocking of actions of other components, water not containing impurities as much as possible is preferably contained as the dispersion medium. Such water is preferably water having a total content of transition metal ions of 100 ppb or less. Herein, the purity of water can be increased by an operation, such as the removal of impurity ions using an ion-exchange resin, the removal of contaminants with a filter, or distillation, for example. Specifically, deionized water (ion exchange water), pure water, ultrapure water, distilled water, and the like are preferably used as the water.

In usual, the water preferably accounts for 90 volume % or more of the dispersion medium contained in the polishing composition, the water more preferably accounts for 95 volume % or more thereof, the water still more preferably accounts for 99 volume % or more thereof, and the water particularly preferably accounts for 100 volume % thereof.

<Erosion Inhibitor>

The polishing composition of one aspect of the present invention preferably further contains an erosion inhibitor containing a surfactant or a compound having a guanidino group.

As the erosion inhibitor containing a surfactant, any one of anionic surfactants, cationic surfactants, nonionic surfactants, and amphoteric surfactants may be used and anionic surfactants are preferably used.

Examples of the erosion inhibitor containing anionic surfactants include alkyl sulfuric acid (salt), alkyl phosphoric acid (salt), alkyl naphthalene sulfonic acid (salt), alkyl benzenesulfonic acid (salt), polyoxyalkylene alkyl sulfuric acid (salt), polyoxyalkylene styrenated phenyl sulfuric acid (salt), polyoxyalkylene alkyl sulfosuccinic acid (salt), polyoxyalkylene allyl phenyl ether phosphoric acid (salt), polyoxyalkylene alkyl phosphoric acid (salt), polyoxyalkylene alkyl acetic acid (salt), polyoxyalkylene alkyl sulfosuccinic acid (salt), alkyl sulfosuccinic acid (salt), alkyl naphthalene sulfonic acid (salt), alkyl diphenyl ether disulfonic acid (salt), and the like. Among the above, it is preferable to use branched sodium alkylbenzene sulfonate (C9-17), sodium dodecylbenzene sulfonate, or polyoxyethylene (n=45-55) allyl phenyl ether phosphate amine salt.

Examples of the erosion inhibitor containing the compound having a guanidino group include creatinine, arginine, and glycocyamine. Among the above, creatinine or arginine is preferably used.

When the polishing composition of one aspect of the present invention contains the erosion inhibitor containing the surfactant, the content of the erosion inhibitor is preferably 0.00001 mass % or more, more preferably 0.00005 mass % or more, and still more preferably 0.0001 mass % or more. When the polishing composition contains the erosion inhibitor containing the surfactant, the content of the erosion inhibitor is preferably 0.01 mass % or less, more preferably 0.005 mass % or less, and still more preferably 0.001 mass % or less. When the content is less than 0.00001 mass %, an erosion inhibiting action is not substantially obtained. When the content exceeds 0.01 mass %, the polishing removal rate of the polysilicon film decreases.

When the polishing composition of one aspect of the present invention contains the erosion inhibitor containing the compound having a guanidino group, the content of the erosion inhibitor is preferably 0.001 mass % or more, more preferably 0.01 mass % or more, and still more preferably 0.05 mass % or more. When the polishing composition contains the erosion inhibitor containing the compound having a guanidino group, the content of the erosion inhibitor is preferably 5 mass % or less, more preferably 2 mass % or less, and still more preferably 1 mass % or less. When the content is less than 0.001 mass %, the erosion inhibiting action is not substantially obtained. When the content exceeds 5 mass %, the polishing removal rate of the polysilicon film decreases.

<Other Additives>

The polishing composition of one aspect of the present invention is preferably free of an oxidant.

The polishing composition of one aspect of the present invention may further contain known additives, such as a chelating agent, a thickener, a dispersant, a surface protective agent, a wetting agent, a surfactant (surfactants different from those contained as the erosion inhibitor), and a dissolution assistant in a range where the effects of the present invention are not impaired. The content of the additives above may be set as appropriate according to the purpose of addition thereof.

<pH of Polishing Composition>

The pH of the polishing composition of the present invention is preferably 8 or more. When the pH is 8 or more, the polishing removal rate is further improved than that in a case where the pH is less than 8. The pH is more preferably 8.5 or more, still more preferably 9.0 or more, and particularly preferably 9.5 or more. On the other hand, from the viewpoint of safety, the pH of the polishing composition is preferably 13.0 or less, more preferably 12.0 or less, and still more preferably 11.5 or less.

More specifically, the pH range of the polishing composition of one aspect of the present invention is preferably 8.0 or more and 13.0 or less, more preferably 8.5 or more and 12.0 or less, still more preferably 9.0 or more and 11.5 or less, and particularly preferably 9.5 or more and 11.5 or less. Hence, the compounding amount of the basic compound is preferably adjusted so that the pH is within the range above.

<Method for Manufacturing Polishing Composition>

A method for manufacturing the polishing composition of one aspect of the present invention is not particularly limited. The polishing composition can be obtained by stirring and mixing the silica particles, the first water-soluble polymer, the second water-soluble polymer, the basic compound, and, as necessary, other additives in the water as a dispersion medium, for example. The details of the components are as described above.

The temperature in mixing the components is not particularly limited and is preferably 10° C. or more and 40° C. or less. Heating may be performed in order to increase the dissolution rate. Mixing time is also not particularly limited insofar as uniform mixing can be performed.

<Polishing Method>

A polishing method including polishing the polishing object containing the film containing the silicon material having a silicon-silicon bond using the polishing composition of one aspect of the present invention is described below.

As a polishing apparatus, a general polishing apparatus is usable which includes a polishing platen to which a holder holding a substrate having a polishing object and the like and a motor capable of varying the number of rotations and the like are attached and a polishing pad (polishing cloth) can be stuck.

As the polishing pad, general non-woven fabric, polyurethane, porous fluororesin, and the like can be used without particular limitation. The polishing pad is preferably subjected to grooving such that a polishing liquid is collected.

With respect to the polishing conditions, the rotational speed of the polishing platen is preferably about 10 rpm (0.17 s$^{-1}$) or more and 500 rpm (8.3 s$^{-1}$) or less, for example. A pressure (polishing pressure) applied to the substrate having a polishing object is preferably 0.5 psi (3.4 kPa) or more and 10 psi (68.9 kPa) or less. A method for supplying the polishing composition to the polishing pad is also not particularly limited and a method including continuously supplying the polishing composition with a pump or the like is adopted. Although the supply amount is not limited, it is preferable that the surface of the polishing pad is always covered with the polishing composition of one aspect of the present invention.

After polishing, the substrate is cleaned in running water, and then water droplets adhering onto the substrate are removed with a spin dryer or the like for drying, thereby obtaining the substrate having a layer containing a metal.

The polishing composition of one aspect of the present invention may be a one-component type or may be a multi-component type including a two-component type. The polishing composition of one aspect of the present invention may be prepared by diluting a stock solution of the polishing composition 10-fold or more, for example, using a diluent, such as water.

Example 1

Hereinafter, Examples and Comparative Examples of the present invention are described but the present invention is not limited to Examples described below. In Examples described below, technically preferable limitations are made in order to carry out the present invention but the limitations are not the indispensable requirements of the present invention. Examples described below can be variously altered or modified and such alternations or modifications may also be included in the present invention.

Preparation of Polishing Composition

Example 1

To water as a dispersion medium, colloidal silica having an average primary particle diameter of 90 nm was added such that the addition amount thereof was 1.5 mass % based on the total amount of a polishing composition, polyvinylpyrrolidone having a weight average molecular weight of 40,000 as the first water-soluble polymer was added such that the addition amount thereof was 0.00300 mass % based on the total amount of the polishing composition, and polyvinylpyrrolidone having a weight average molecular weight of 10,000 as the second water-soluble polymer was added such that the addition amount thereof was 0.00300 mass % based on the total amount of the polishing composition to give a mixed solution.

Thereafter, ammonia was added to the obtained mixed liquid such that the pH was 10.4, followed by stirring and mixing at room temperature (25° C.) for 30 minutes, thereby preparing the polishing composition. In the polishing composition, the ratio of the content (W1) of the first water-soluble polymer to the content (W2) of the second water-soluble polymer (W1/W2) is 1.

The pH of the polishing composition (liquid temperature: 25° C.) was confirmed with a pH meter (Model Number: LAQUA, manufactured by HORIBA, LTD.).

Example 2

The addition amount of each of the polyvinylpyrrolidone having a weight average molecular weight of 40,000 and the polyvinylpyrrolidone having a weight average molecular weight of 10,000 based on the total amount of a polishing composition was set to 0.00200 mass %. The polishing composition was prepared in the same manner as in Example 1 except the above.

Example 3

Colloidal silica having an average primary particle diameter of 70 nm was used in place of the colloidal silica having an average primary particle diameter of 90 nm. The addition amount of each of the polyvinylpyrrolidone having a weight average molecular weight of 40,000 and the polyvinylpyrrolidone having a weight average molecular weight of 10,000 based on the total amount of a polishing composition was set to 0.00025 mass %. Potassium hydroxide, in place of ammonia, was added such that the pH was 10.7. The polishing composition was prepared in the same manner as in Example 1 except these points.

Example 4

Polyvinylpyrrolidone having a weight average molecular weight of 100,000 was used in place of the polyvinylpyrrolidone having a weight average molecular weight of 40,000. A polishing composition was prepared in the same manner as in Example 1 except the above.

Example 5

Colloidal silica having an average primary particle diameter of 70 nm was used in place of the colloidal silica having an average primary particle diameter of 90 nm. The addition amount of the polyvinylpyrrolidone having a weight average molecular weight of 40,000 based on the total amount of a polishing composition was set to 0.00050 mass %. The addition amount of the polyvinylpyrrolidone having a weight average molecular weight of 10,000 based on the total amount of the polishing composition was set to 0.00005 mass %. The ratio (W1/W2) is 10. The polishing composition was prepared in the same manner as in Example 1 except these points.

Example 6

Colloidal silica having an average primary particle diameter of 70 nm was used in place of the colloidal silica having an average primary particle diameter of 90 nm. The addition amount of the polyvinylpyrrolidone having a weight average molecular weight of 40,000 based on the total amount of a polishing composition was set to 0.00005 mass %. The addition amount of the polyvinylpyrrolidone having a weight average molecular weight of 10,000 based on the total amount of the polishing composition was set to 0.00050 mass %. The ratio (W1/W2) is 1/10. The polishing composition was prepared in the same manner as in Example 1 except these points.

Example 7

Colloidal silica having an average primary particle diameter of 70 nm was used in place of the colloidal silica having an average primary particle diameter of 90 nm. The addition amount of the polyvinylpyrrolidone having a weight average molecular weight of 40,000 based on the total amount of a polishing composition was set to 0.00005 mass %. The addition amount of the polyvinylpyrrolidone having a weight average molecular weight of 10,000 based on the total amount of the polishing composition was set to 0.00005 mass %. The ratio (W1/W2) is 1. Further, ammonia was added in an amount such that the amount based on the total amount of the polishing composition was 0.194 mass %. The obtained polishing composition was confirmed to be 10.3. The polishing composition was prepared in the same manner as in Example 1 except these points.

Example 8

Potassium hydroxide was added in place of ammonia. The polishing composition was prepared in the same manner as in Example 7 except these points. The pH of the obtained polishing composition was confirmed to be 10.7.

Example 9

To water as a dispersion medium, colloidal silica having an average primary particle diameter of 70 nm was added such that the addition amount thereof was 1.5 mass % based on the total amount of a polishing composition, polyvinylpyrrolidone having a weight average molecular weight of 40,000 as the first water-soluble polymer was added such that the addition amount thereof was 0.00005 mass % based on the total amount of the polishing composition, and polyvinylpyrrolidone having a weight average molecular weight of 10,000 as the second water-soluble polymer was added such that the addition amount thereof was 0.00005 mass % based on the total amount of the polishing composition, and branched sodium alkylbenzene sulfonate (C9-17) as the erosion inhibitor was added such that the addition amount thereof was 0.0005 mass % based on the total amount of the polishing composition to give a mixed liquid.

Thereafter, potassium hydroxide was added to the obtained mixed liquid in an amount such that the addition amount thereof was 0.194 mass % based on the total amount of the polishing composition, followed by stirring and mixing at room temperature (25° C.) for 30 minutes, thereby preparing the polishing composition. The pH of the obtained polishing composition was confirmed to be 10.7. In the polishing composition, the ratio of the content (W1) of the first water-soluble polymer to the content (W2) of the second water-soluble polymer (W1/W2) is 1.

Example 10

Sodium dodecylbenzenesulfonate was used as the erosion inhibitor. A polishing composition was prepared in the same manner as in Example 9 except the above point. The pH of the obtained polishing composition was confirmed to be 10.7.

Example 11

Polyoxyethylene (n=45-55) allyl phenyl ether phosphate amine salt was used as the erosion inhibitor.

A polishing composition was prepared in the same manner as in Example 9 except the above point. The pH of the obtained polishing composition was confirmed to be 10.7.

Example 12

Polyoxyethylene (n=8) styrenated phenyl ether ammonium sulfate was used as the erosion inhibitor. A polishing composition was prepared in the same manner as in Example 9 except the above point. The pH of the obtained polishing composition was confirmed to be 10.7.

Example 13

As the erosion inhibitor, creatinine was added such that the addition amount thereof was 0.1 mass % based on the total amount of a polishing composition. The polishing composition was prepared in the same manner as in Example 9 except the above point. The pH of the obtained polishing composition was confirmed to be 10.7.

Example 14

As the erosion inhibitor, arginine was added such that the addition amount was 0.1 mass % based on the total amount of a polishing composition. The polishing composition was prepared in the same manner as in Example 9 except the above point. The pH of the obtained polishing composition was confirmed to be 10.8.

Comparative Example 1

Neither of the polyvinylpyrrolidones were added. Potassium hydroxide, in place of ammonia, was added such that the pH was 10.7. A polishing composition was prepared in the same manner as in Example 1 except these points.

Comparative Example 2

Neither of the polyvinylpyrrolidones were added.
A polishing composition was prepared in the same manner as in Example 1 except the above.

Comparative Example 3

The addition amount of the polyvinylpyrrolidone having a weight average molecular weight of 40,000 based on the total amount of a polishing composition was set to 0.01000 mass %. The polyvinylpyrrolidone having a weight average molecular weight of 10,000 was not added. The polishing composition was prepared in the same manner as in Example 1 except these points.

Comparative Example 4

The addition amount of the polyvinylpyrrolidone having a weight average molecular weight of 10,000 based on the total amount of a polishing composition was set to 0.00250 mass %. The polyvinylpyrrolidone having a weight average molecular weight of 40,000 was not added. The polishing composition was prepared in the same manner as in Example 1 except these points.

Comparative Example 5

The addition amount of the polyvinylpyrrolidone having a weight average molecular weight of 40,000 based on the total amount of a polishing composition was set to 0.00250 mass %. The polyvinylpyrrolidone having a weight average molecular weight of 10,000 was not added. The polishing composition was prepared in the same manner as in Example 1 except these points.

Comparative Example 6

Polyvinylpyrrolidone having a weight average molecular weight of 300,000 was added in place of the polyvinylpyrrolidone having a weight average molecular weight of 40,000. A polishing composition was prepared in the same manner as in Example 1 except the above.

<Measurement of Polishing Removal Rate>

Using the obtained polishing compositions, CMP polishing was performed to a polysilicon film which was not doped at all (hereinafter, referred to as "Non-Doped poly-Si film"), a film containing a pattern containing a polysilicon film doped with phosphorus (hereinafter referred to as "Doped poly-PTW film"), a silicon oxide film, and a silicon nitride film to investigate the polishing removal rate.

(Wafer for Polishing Removal Rate Measurement)

The measurement of the polishing removal rate of each film was performed using a CMP evaluation wafer described below.

For polishing Non-Doped poly-Si film: Blanket wafer (300 mm) having a 5,000 Å thick polysilicon film formed on the surface of a silicon wafer, manufactured by Advanced Materials Technology.

For polishing Doped poly-PTW film: Wafer (300 mm) having 854 mask patterns, in which a 1000 Å thick silicon nitride film was formed on a silicon wafer, a 800 Å deep trench was formed and a 2000 Å Poly-Si film doped with phosphorus (phosphorus concentration of 0.1 mass %) was formed to bury irregularities, manufactured by ADVANTEC CO., LTD.

For polishing silicon oxide film: Blanket wafer (300 mm) having a 10,000 Å thick silicon oxide film (TEOS film) formed on the surface of a silicon wafer, manufactured by ADVANTEC CO., LTD.

For polishing silicon nitride film: Blanket wafer (300 mm) having a 3,500 Å thick silicon nitride film (SiN film) formed on the surface of a silicon wafer, manufactured by Advanced Materials Technology.

(Polishing Apparatus and Polishing Conditions)

A used polishing apparatus and polishing conditions were as follows.

Polishing apparatus: CMP single-sided polishing apparatus, 300 mm Reflexion LK, manufactured by Applied Materials Pad: Rigid polyurethane pad IC1010, manufactured by Nitta Haas Incorporated Polishing pressure: 2.2 psi
Number of rotations of polishing platen: 73 rpm
Number of rotations of carrier: 67 rpm
Supply of polishing composition: One-way
Supply amount of polishing composition: 200 ml/min
Polishing time: 60 seconds A calculated value obtained by dividing a value, which was obtained by subtracting the film thickness (Å) of each film after polishing from the film thickness (Å) of each film before polishing, by the polishing time (min) was set as the polishing removal rate (Removal Rate; RR).

The film thicknesses (Å) of each film before and after the polishing were determined by an optical interference film thickness meter (Model Number: ASET-f5x, manufactured by KLA-Tencor).

<Polishing Test>

A polishing test was performed which includes polishing a polishing object in which a pattern containing a silicon nitride film was formed on a silicon wafer through an oxide film and a polysilicon film was formed on the pattern using the obtained polishing compositions by the CMP method to form circuit patterns containing the polysilicon film.

As illustrated in FIG. 1, a polishing object 1 is configured so that a pattern 3 containing a silicon nitride film is formed on a silicon wafer 1 through an oxide film 2 and a polysilicon film 4 is formed on the pattern 3. A thickness T1 of the pattern 3 containing the silicon nitride film is 1000 Å. A line width H1 is 10 μm or 0.25 μm. An interval H2 is 10 μm or 0.25 μm. A thickness T2 of the polysilicon film 4 is 2000 Å.

Figure 2:
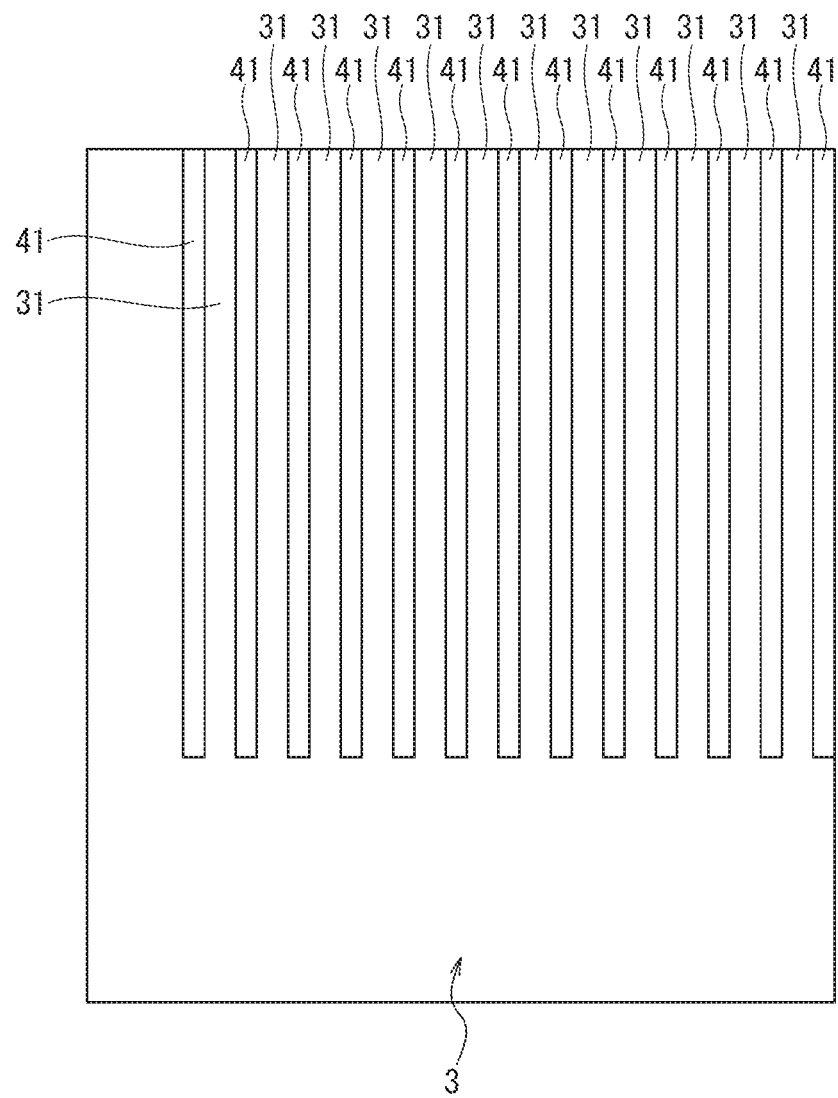
FIG. 2 is a plan view illustrating a state where a polysilicon film does not remain on the polishing object after subjected to the polishing test in Examples (Excellent).

When ideal polishing was performed to the polishing object 10, a state was reached in which the polysilicon film 4 did not remain on the pattern 3 containing the silicon nitride film, so that the entire upper surface of the pattern 3 was exposed, and then a state was reached in which circuit patterns 41 containing the polysilicon film were formed and linear patterns 31 containing the silicon nitride film were present between the adjacent circuit patterns 41. FIG. 2 is a plan view illustrating this state.

(Polishing Apparatus and Polishing Conditions)

A used polishing apparatus and polishing conditions were as follows.

Polishing apparatus: CMP single-sided polishing apparatus, 300 mm Reflexion LK, manufactured by Applied Materials Pad: Rigid polyurethane pad IC1010, manufactured by Nitta Haas Incorporated
Polishing pressure: 2.2 psi
Number of rotations of polishing platen: 73 rpm
Number of rotations of carrier: 67 rpm
Supply of polishing composition: One-way
Supply amount of polishing composition: 200 ml/min
Polishing time: 15 seconds
(Performance Evaluation)

The surface state of the polishing object 10 after the polishing test was observed with an atomic force microscope (Trade Name WA-1300, manufactured by Hitachi Construction Machinery Finetec Co., Ltd.) to investigate the remaining state of the polysilicon film 4 to be scraped off and measure the dishing amounts of the circuit patterns 41 with a width of 10 μm and the erosion amount of the linear patterns 31 with a width of 0.25 μm.

The remaining state of the polysilicon film 4 to be scraped off was evaluated as follows.

Excellent: State in which the polysilicon film 4 did not remain on the polishing object 10 (for example, state of FIG. 2).

Figure 3:
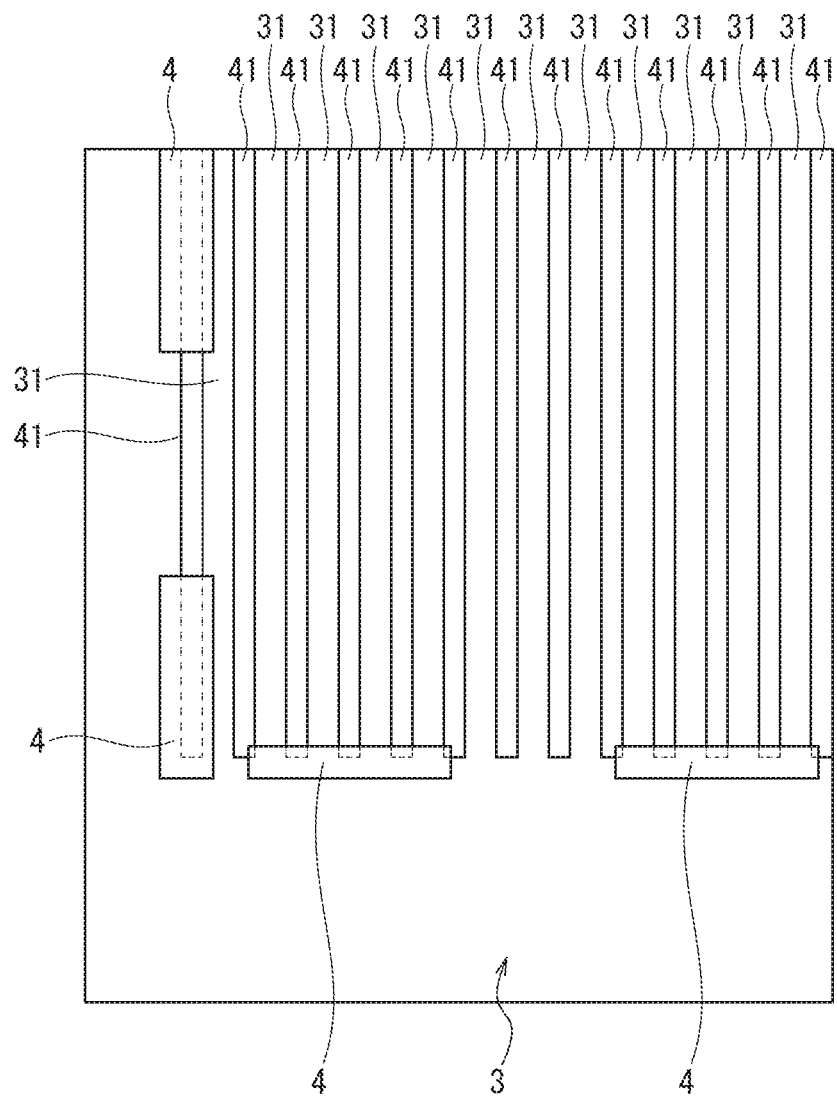
FIG. 3 is a plan view illustrating a state where the polysilicon film partially remains on the polishing object after subjected to the polishing test in Examples but no problems occur (Good).

Good: State in which the polysilicon film 4 partially remained on the polishing object 10 but no problems occurred (for example, state of FIG. 3).

Poor: State in which most of the polysilicon film 4 remained on the polishing object 10 and a problem occurred (for example, state of FIG. 4).

The measured values of the polishing removal rate and the polishing test results obtained above are illustrated together with the configuration of each polishing composition in Table 1.

TABLE 1

| | Average primary particle diameter of abrasives (colloidal silica) | Polyvinylpyrrolidone (high molecular weight) Mw | Polyvinylpyrrolidone (high molecular weight) Ratio of Content (mass %) | Polyvinylpyrrolidone (low molecular weight) Mw | Polyvinylpyrrolidone (low molecular weight) Ratio of Content (mass %) | Total content of polyvinylpyrrolidones (mass %) | Erosion inhibitor Compound name | Erosion inhibitor Ratio of Content (mass %) | Basic compound | pH |
|---|---|---|---|---|---|---|---|---|---|---|
| Ex. 1 | 90 nm | 40,000 | 0.00300 | 10,000 | 0.00300 | 0.00600 | — | — | Ammonia | 10.4 |
| Ex. 2 | 90 nm | 40,000 | 0.00200 | 10,000 | 0.00200 | 0.00400 | — | — | Ammonia | 10.4 |
| Ex. 3 | 70 nm | 40,000 | 0.00025 | 10,000 | 0.00025 | 0.00050 | — | — | Potassium hydroxide | 10.7 |
| Ex. 4 | 90 nm | 100,000 | 0.00300 | 10,000 | 0.00300 | 0.00600 | — | — | Ammonia | 10.4 |
| Ex. 5 | 70 nm | 40,000 | 0.00050 | 10,000 | 0.00005 | 0.00055 | — | — | Ammonia | 10.4 |
| Ex. 6 | 70 nm | 40,000 | 0.00005 | 10,000 | 0.00050 | 0.00055 | — | — | Ammonia | 10.4 |
| Ex. 7 | 70 nm | 40,000 | 0.00005 | 10,000 | 0.00005 | 0.00010 | — | — | Ammonia | 10.3 |
| Ex. 8 | 70 nm | 40,000 | 0.00005 | 10,000 | 0.00005 | 0.00010 | — | — | Potassium hydroxide | 10.7 |
| Ex. 9 | 70 nm | 40,000 | 0.00005 | 10,000 | 0.00005 | 0.00010 | Branched sodium alkylbenzene sulfonate (C9-17) | 0.0005 | Potassium hydroxide | 10.7 |
| Ex. 10 | 70 nm | 40,000 | 0.00005 | 10,000 | 0.00005 | 0.00010 | Sodium dodecylbenzene sulfonate | 0.0005 | Potassium hydroxide | 10.7 |
| Ex. 11 | 70 nm | 40,000 | 0.00005 | 10,000 | 0.00005 | 0.00010 | Polyoxyethylene (n = 45-55) allyl phenyl ether phosphate amine salt | 0.0005 | Potassium hydroxide | 10.7 |
| Ex. 12 | 70 nm | 40,000 | 0.00005 | 10,000 | 0.00005 | 0.00010 | Polyoxyethylene (n = 8) styrenated phenyl ether ammonium sulfate | 0.0005 | Potassium hydroxide | 10.7 |
| Ex. 13 | 70 nm | 40,000 | 0.00005 | 10,000 | 0.00005 | 0.00010 | Creatinine | 0.1 | Potassium hydroxide | 10.7 |
| Ex. 14 | 70 nm | 40,000 | 0.00005 | 10,000 | 0.00005 | 0.00010 | Arginine | 0.1 | Potassium hydroxide | 10.8 |
| Comp. Ex. 1 | 90 nm | — | — | — | — | — | — | — | Potassium hydroxide | 10.7 |
| Comp. Ex. 2 | 90 nm | — | — | — | — | — | — | — | Ammonia | 10.5 |
| Comp. Ex. 3 | 90 nm | 40,000 | 0.01000 | — | — | 0.01000 | — | — | Ammonia | 10.4 |
| Comp. Ex. 4 | 90 nm | — | — | 10,000 | 0.00250 | 0.00250 | — | — | Ammonia | 10.4 |
| Comp. Ex. 5 | 90 nm | 40,000 | 0.00250 | — | — | 0.00250 | — | — | Ammonia | 10.4 |
| Comp. Ex. 6 | 90 nm | 300,000 | 0.00300 | 10,000 | 0.00300 | 0.00600 | — | — | Ammonia | 10.4 |

| | Polishing removal rate (Å/min) Non-Doped Poly-Si | Polishing removal rate (Å/min) Doped poly-PTW | Polishing removal rate (Å/min) TEOS Si oxide film | Polishing removal rate (Å/min) SiN | Poly-Si remaining reducing effect | Dishing (Å) | Erosion (Å) |
|---|---|---|---|---|---|---|---|
| Ex. 1 | 2903 | 3593 | 50 | 35 | Excellent | 139 | 64 |
| Ex. 2 | 2796 | 3105 | 63 | 5 | Excellent | 143 | 81 |
| Ex. 3 | 2378 | 2017 | 70 | 22 | Excellent | 157 | 87 |
| Ex. 4 | 2256 | 3157 | 42 | 41 | Excellent | 135 | 75 |
| Ex. 5 | 2373 | 2012 | 67 | 25 | Good | 157 | 83 |

TABLE 1-continued

|  |  |  |  |  |  |  |  |
|---|---|---|---|---|---|---|---|
| Ex. 6 | 2416 | 2054 | 69 | 24 | Excellent | 161 | 88 |
| Ex. 7 | 2456 | 2109 | 66 | 24 | Good | 160 | 87 |
| Ex. 8 | 2320 | 2835 | 73 | 28 | Excellent | 146 | 70 |
| Ex. 9 | 2480 | 2442 | 74 | 24 | Excellent | 141 | 58 |
| Ex. 10 | 2500 | 2657 | 70 | 29 | Excellent | 139 | 57 |
| Ex. 11 | 2448 | 2776 | 74 | 27 | Good | 139 | 52 |
| Ex. 12 | 2439 | 2398 | 69 | 18 | Excellent | 143 | 57 |
| Ex. 13 | 2600 | 2813 | 72 | 26 | Excellent | 149 | 65 |
| Ex. 14 | 2217 | 2944 | 75 | 28 | Excellent | 151 | 66 |
| Comp. Ex. 1 | 2432 | 2537 | 183 | 69 | Excellent | 173 | 132 |
| Comp. Ex. 2 | 2646 | 3040 | 50 | 45 | Excellent | 137 | 133 |
| Comp. Ex. 3 | 2212 | 3457 | 34 | 45 | Poor | 99 | 46 |
| Comp. Ex. 4 | 2665 | 3529 | 76 | 49 | Excellent | 147 | 98 |
| Comp. Ex. 5 | 2653 | 3454 | 57 | 46 | Excellent | 154 | 127 |
| Comp. Ex. 6 | 1973 | 3025 | 48 | 42 | Poor | 87 | 39 |

In the case of the polishing using the polishing compositions of Examples 1 to 4, 6, 8 to 10, 12 to 14, the polysilicon film 4 to be scraped off did not remain and the state illustrated in FIG. 2 was reached (which is indicated as "Excellent" in Table 1). The dishing amount of the circuit patterns 41 was 161 Å or less, which is lower than 173 Å of Comparative Example 1. The erosion amount of the linear patterns 31 was 88 Å or less, which is lower than 132 Å of Comparative Example 1.

In the case of the polishing using the polishing compositions of Examples 5, 7, 11, the polysilicon film 4 to be scraped off partially remained but most of the patterns 31 containing the silicon nitride film between the circuit patterns 41 were almost exposed (for example, state of FIG. 3) and no problems occurred (which is indicated as "Good" in Table 1). The dishing amount of the circuit patterns 41 was 157 Å, which is lower than 173 Å of Comparative Example 1. The erosion amount of the linear patterns 31 was 87 Å or less, which is lower than 132 Å of Comparative Example 1.

In the case of the polishing using the polishing compositions of Comparative Examples 1, 2, 4, 5, the polysilicon film 4 to be scraped off did not remain and a state illustrated in FIG. 2 was reached (which is indicated as "Good" in Table 1). In Comparative Example 1, the dishing amount of the circuit patterns 41 was as high as 173 Å. The erosion amount of the linear patterns 31 was also as high as 132 Å. In Comparative Example 2, the erosion amount of the linear patterns 31 was as high as 133 Å. In Comparative Example 4, the erosion amount of the linear patterns 31 was as high as 98 Å. In Comparative Example 5, the erosion amount of the linear patterns 31 was as high as 127 Å.

Figure 4:
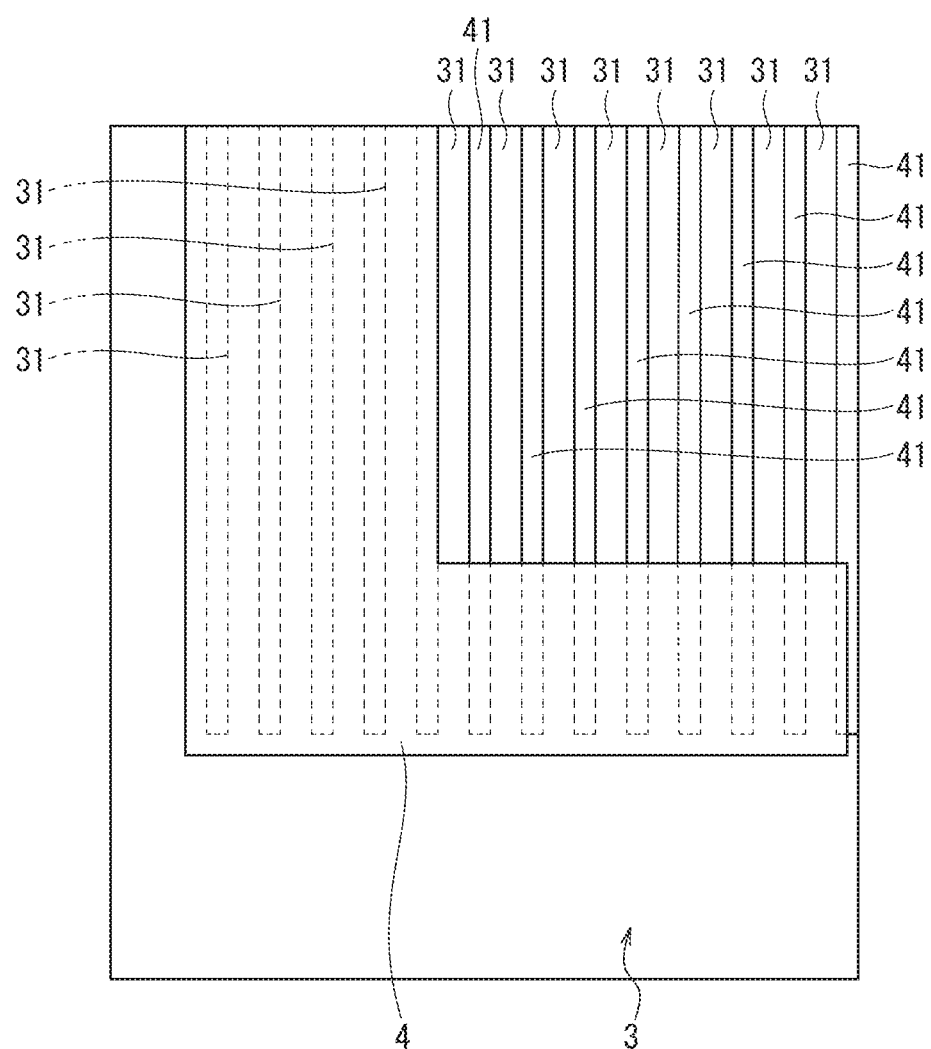
FIG. 4 is a plan view illustrating a state where most of the polysilicon film remains on the polishing object after subjected to the polishing test in Examples and a problem occurs (Poor).

In the case of the polishing using the polishing compositions of Comparative Example 3 and Comparative Example 6, most of the polysilicon film 4 to be scraped off remained. For example, as illustrated in FIG. 4, there were also a large number of portions in a state in which the patterns 31 containing the silicon nitride film between the circuit patterns 41 were not exposed at all in the entire longitudinal direction of the wiring lines (which is indicated as "Poor" in Table 1).

The results above showed that the polishing compositions of Examples 1 to 14 obtained an effect capable of reducing the remaining of the polysilicon film to be scraped off and an inhibitory effect of the dishing and the erosion. On the other hand, the polishing compositions of Comparative Examples 1 to 6 were not able to obtain either one of the effects. In the polishing compositions of Examples 1 to 14, the polishing removal rates of the polysilicon films were 2256 to 2903 Å/min, which were almost equal to the polishing removal rates (2432 to 2646 Å/min) of the polysilicon films by the polishing compositions of Comparative Examples 1 and 2 not containing polyvinylpyrrolidone.

When the polishing compositions of Example 7 and Example 8 different only in the kind of the basic compound contained therein are compared with each other, the remaining reducing effect of the polysilicon film 4 to be scraped off was higher and the dishing amount of the circuit patterns 41 and the erosion amount of the linear patterns 31 were smaller in the polishing using the polishing composition of Example 8 containing potassium hydroxide than in the polishing using the polishing composition of Example 7 containing ammonia. This result shows that potassium hydroxide is more preferably used as the basic compound than ammonia.

A comparison between the polishing composition of Example 8 with the polishing compositions of Examples 9 to different only in whether the erosion inhibitor is contained shows that the erosion amount can be further reduced in the polishing using the polishing compositions of Examples 9 to 14 containing the erosion inhibitor than in the polishing using the polishing composition of Example 8 not containing the erosion inhibitor.

EXPLANATION OF REFERENCE NUMERALS 10 polishing object
1 silicon wafer
2 oxide film
3 pattern containing silicon nitride film
4 polysilicon film
41 circuit pattern containing polysilicon film
31 linear pattern containing silicon nitride film

What is claimed is:
1. A polishing composition comprising:
silica abrasives;
a first water-soluble polymer containing a polymer compound containing a lactam ring and having a weight average molecular weight of less than 35,000 or more and 150,000 or less;
a second water-soluble polymer containing a polymer compound containing a lactam ring and having a weight average molecular weight of 1,000 or more and less than 25,000, and the weight average molecular weight of the second water-soluble polymer is smaller than the weight average molecular weight of the first water-soluble polymer;
a basic compound; and
water,
wherein a total content of the first water-soluble polymer and the second water-soluble polymer is 0.006 mass % or less, and wherein a ratio of a content (W1) of the first water-soluble polymer to a content (W2) of the second water-soluble polymer (W1/W2) is 1/15 or more and 15/1 or less.

2. A polishing method comprising:
polishing a polishing object containing a film containing a silicon material having a silicon-silicon bond using the polishing composition according to claim 1.

3. A polishing method comprising:
polishing a polishing object having a film containing a silicon material having a silicon-silicon bond formed on a pattern containing an insulating film using the polishing composition according to claim 1 by a CMP method to form a circuit pattern containing the silicon material.

4. The polishing composition according to claim 1, wherein the first water-soluble polymer and the second water-soluble polymer are polyvinylpyrrolidones.

5. The polishing composition according to claim 4, wherein a total content of the first water-soluble polymer and the second water-soluble polymer is 0.05 mass % or less.

6. The polishing composition according to claim 1 further comprising: an erosion inhibitor containing a surfactant or a compound having a guanidino group.

7. The polishing composition according to claim 6, wherein the surfactant is an anionic surfactant.

8. The polishing composition according to claim 6, wherein the compound having a guanidino group is creatinine or arginine.

9. The polishing composition according to claim 1, wherein the first water-soluble polymer and the second water-soluble polymer are homopolymers containing a monomer containing a compound containing a lactam ring or copolymers containing a monomer containing a compound containing a lactam ring and a monomer containing a compound not containing a lactam ring.

10. The polishing composition according to claim 9, wherein a total content of the first water-soluble polymer and the second water-soluble polymer is 0.05 mass % or less.

11. The polishing composition according to claim 9 comprising:
as the monomer containing a compound containing a lactam ring, at least one kind selected from the group consisting of vinylpyrrolidone, vinylcaprolactam, vinylvalerolactam, vinyllaurolactam, and vinylpiperidone.

12. The polishing composition according to claim 11, wherein a total content of the first water-soluble polymer and the second water-soluble polymer is 0.05 mass % or less.

13. The polishing composition according to claim 9 comprising:
as the homopolymer, at least one kind selected from the group consisting of polyvinylpyrrolidone, polyvinylcaprolactam, polyvinylvalerolactam, polyvinyllaurolactam, and polyvinylpiperidone.

14. The polishing composition according to claim 13, wherein a total content of the first water-soluble polymer and the second water-soluble polymer is 0.05 mass % or less.

* * * * *